United States Patent [19]

Bohner et al.

[11] Patent Number: 4,724,335
[45] Date of Patent: Feb. 9, 1988

[54] RELAY AUTHORIZING OR INTERRUPTING THE FLOW OF A CURRENT IN A LOAD CIRCUIT AND APPLICATION OF THIS RELAY TO A LOAD CIRCUIT IN WHICH FLOWS A RANDOM DIRECTION CURRENT OR AN ALTERNATING CURRENT

[75] Inventors: Gérard Bohner, Meudon; Alain Nakach, Orsay; Jean Sole, Saint-Cloud; Pierre Starzynski, Nemours, all of France

[73] Assignee: Commissariat a l'Energie Atomique, Paris, France

[21] Appl. No.: 865,335

[22] Filed: May 21, 1986

[30] Foreign Application Priority Data

May 31, 1985 [FR] France ............... 85 08228

[51] Int. Cl.[4] ............... H01H 47/00
[52] U.S. Cl. ............... 307/140; 323/351
[58] Field of Search ............... 323/318, 349, 351; 307/132 E, 132 V, 139, 140

[56] References Cited

U.S. PATENT DOCUMENTS

| | | | |
|---|---|---|---|
| 3,233,125 | 2/1966 | Buie | 307/88.5 |
| 3,731,004 | 5/1973 | Cowpland et al. | 179/84 T |
| 3,766,404 | 10/1973 | Larson et al. | 307/140 X |
| 3,835,368 | 9/1974 | Williams | 323/351 |
| 4,093,874 | 6/1978 | Pollitt | 307/251 |
| 4,256,978 | 3/1981 | Pinckaers | 323/351 X |
| 4,325,021 | 4/1982 | McMackin | 323/351 |
| 4,337,494 | 6/1982 | Huykman | 361/86 |
| 4,412,279 | 10/1983 | Franklin | 323/351 X |
| 4,455,055 | 4/1984 | Bete | 323/351 X |
| 4,480,194 | 10/1984 | Barthelemy et al. | 307/132 E |
| 4,491,744 | 1/1985 | Corey | 307/270 |
| 4,564,768 | 1/1986 | Kamiya et al. | 307/140 |

FOREIGN PATENT DOCUMENTS

| | | |
|---|---|---|
| 1905560 | 4/1970 | Fed. Rep. of Germany . |
| 3120529 | 4/1982 | Fed. Rep. of Germany . |
| 1274528 | 9/1961 | France . |
| 2069107 | 9/1971 | France . |
| 2418577 | 9/1979 | France . |
| 1124010 | 8/1968 | United Kingdom . |

Primary Examiner—Patrick R. Salce
Assistant Examiner—Marc S. Hoff
Attorney, Agent, or Firm—Oblon, Fisher, Spivak, McClelland & Maier

[57] ABSTRACT

The invention relates to a relay authorizing or interrupting the flow of a current in a load circuit.

This relay comprises a static electronic switch connected to the load circuit, a control circuit connected to the switch for authorizing or interrupting the flow of current in the load circuit due to the switch. The control circuit comprises a supply input connected to one point of the load circuit and, connected in series between said input and the load circuit, a control switch, a current generator with two terminals and at least one impedance limiting the current flowing in the load circuit to a negligible value compared with the value of the current flowing in the load circuit when said flow is permitted. The voltage at the terminals of the generator is at least equal to the highest voltage between two random points of the load circuit.

Application to circuits in which flows a current with a random direction or an alternating current, or to a current inverter.

19 Claims, 9 Drawing Figures

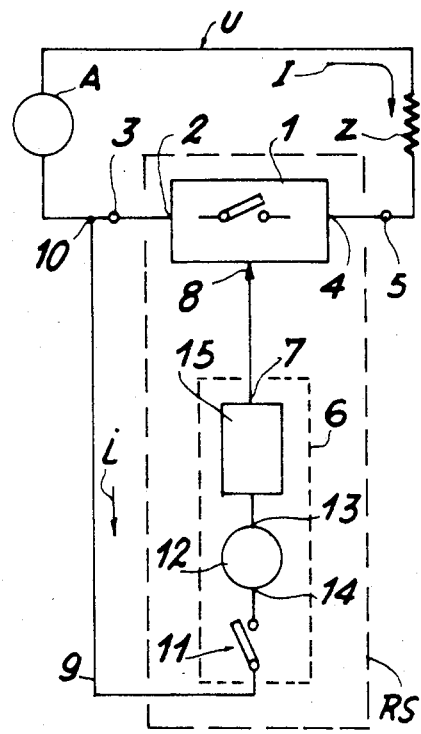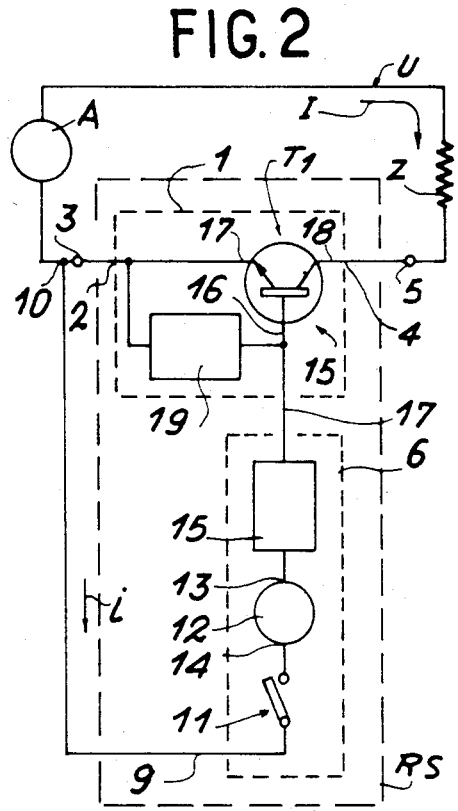

RELAY AUTHORIZING OR INTERRUPTING THE FLOW OF A CURRENT IN A LOAD CIRCUIT AND APPLICATION OF THIS RELAY TO A LOAD CIRCUIT IN WHICH FLOWS A RANDOM DIRECTION CURRENT OR AN ALTERNATING CURRENT

BACKGROUND OF THE INVENTION

The present invention relates to a relay authorizing or interrupting the flow of a current in a load circuit. It also relates to the application of this relay to a load circuit in which a random direction or alternating current flows.

At present two types of relay are known, namely electromechanical relays and static electronic relays.

Electrochemical relays comprise a control electromagnet, whose moving armature controls the opening or closing of contacts. These relays are essentially defined by their interrupting or breaking power, i.e. the maximum load current I and the maximum load voltage V, their control quantity, i.e. the a.c. or d.c. current I or voltage V flowing in the control electromagnet and their insulation voltage between the load circuit and the electromagnet control circuit.

The essential advantage of these relays is that they can be inserted at any random point in an existing electric circuit, provided that their limiting characteristics V. I, v, i as well as the insulation voltage are not exceeded. They also make it possible to separate the control current and the load current, whilst being simple and inexpensive.

However, they suffer from disadvantages which are difficult to overcome. Thus, they are slow (due to their mechanical inertia), their switching time generally being a few dozen milliseconds in the case of power relays. They produce breaking sparks, which lead to rapid wear to the contacts, which can also corrode. Thus, designers only guarantee the relays produced by them for a limited number of switching operations, under clearly defined operating conditions. They are noisy, generate vibrations, sensitive to shocks and consume a certain electric power, even though the load or use current is zero.

Most known static electronic relays are not available in the form of independent components, which can be incorporated into a random load circuit. Generally, these static relays are special circuits included in an electronic assembly having the function of a relay and used at the same time as the other components of said assembly. No relays exist which use static components having certain of the advantageous characteristics of electromechanical relays, so that they can be substituted for an electromechanical relay between two random points of an existing electronic assembly, without leading to modifications to the latter.

Thus, the construction of an electronic static relay requires the supply of its components, which raises significant difficulties if the voltage to be switched is of a floating nature with respect to a reference earth. The known static relays also cause insulation and leakage current problems between the load circuit and the control circuit. Moreover, they function very inadequately in the vicinity of a zero load current. They cannot be switched at a very high frequency.

Recently an independent electronic static relay with photoelectric coupling has become available, but said relay has a very specific use range and does not operate at zero currents or voltages.

The known static relays having these disadvantages can comprise either thyristors or transistors. Thyristor static relays use an insulated supply circuit and do not operate correctly when the load current passing through the transistor drops below one tenth of the nominal value of said current.

The transistor static relay also uses an insulated supply, if it is wished to introduce said relay between two random points of a load circuit.

SUMMARY OF THE INVENTION

The object of the present invention is to obviate the disadvantages of electromagnetic relays and the disadvantages of static electronic relays using thyristors or transistors. It more particularly aims at producing static relays having no moving parts and which do not produce a breaking spark in a load circuit. It also aims at obtaining a floating relay not making it necessary to fix the potential of at least one of its points, or connect one of its points to a reference earth. This relay can function in a random load circuit without it being necessary to introduce a particular or supplementary supply for supplying its components. It can be inserted between two random points of a load circuit and can function from a load current having a maximum value intensity up to a current having a zero value intensity. Its switching frequency can be very high compared with that of an electromechanical relay and the switched current can be a high frequency current reaching several MHz.

Thus, the present invention relates to a relay authorizing or interrupting the flow of a current in a load circuit, comprising a static electronic switch having one terminal connected to one end of the load circuit and another terminal connected to another end of said circuit, and a control circuit having a control output connected to a control input of the switch to authorize or interrupt the flow of current in the load circuit and between the two switch terminals, wherein the control circuit comprises a supply input connected to one point of the load circuit and, connected in series between said input and the control output, a control switch, a current generator with two terminals and at least one impedance limiting the current flowing in the control circuit to a negligible value compared with the value of the current flowing in the load circuit when said flow is authorized by the closing of the switch, the voltage at the generator terminals being at least equal to the highest voltage between two random points of the load circuit.

According to another feature of the invention, the static switch is a transistor having a control electrode connected to the control output of the control circuit, two other electrodes of said transistor being respectively connected to the two ends of the load circuit, said transistor being blocked when the control switch is open and being saturated when the control switch is closed.

According to a first variant, the transistor is a bipolar transistor, whereof the base constitutes the control electrode and whereof the emitter and collector constitute the two electrodes which are respectively connected to the two ends of the load circuit.

According to another feature of this variant, the switch also comprises another impedance connecting the base and emitter and the bipolar transistor to maintain said transistor in the blocked or off state when the control switch is open.

According to a second variant, the transistor is a field effect transistor, whose gate constitutes the control electrode and whose source and drain constitute the electrodes respectively connected to the two ends of the load circuit.

According to another feature of said second variant, the switch also comprises an impedance connecting the source and gate of the field effect transistor to maintain said transistor in the off state when the control switch is open.

According to another feature of the first variant, the relay also comprises a current amplifier connected between the output of the control circuit and the base of the bipolar transistor, so as to produce an emitter-base current of the bipolar transistor, bringing about the saturation thereof, from the current supplied by the current generator, when the control switch is closed.

According to yet another feature of the same variant, the current amplifier is an amplifier incorporating at least one transistor, said transistor being polarized by the voltage available between said ends of the load circuit.

According to another feature of the same variant, the current generator is connected into the control circuit so as to supply no current to the amplifier when the control switch is open, the bipolar transistor being off.

According to another feature of the same variant, a diode is connected to the collector of the bipolar transistor, the conducting direction of said diode being that of the current flowing in the emitter-collector circuit of said transistor, the ends of the load circuit being respectively connected to one of the electrodes of said diode and to the emitter of the bipolar transistor.

According to another feature, the impedance limiting the value of the current flowing in the control circuit comprises a high value resistance or resistor, so as to make said current negligible compared with the current flowing in the load circuit.

According to another feature, the impedance limiting the current also comprises a diode connected in series with the high value resistance, the conducting direction of said diode corresponding to the direction of the current in the control electrode of the transistor.

According to another feature of the first variant, the other impedance connecting the base to the emitter of the bipolar transistor comprises a polarization or bias resistance.

According to another feature of the same variant, the other impedance connecting the base to the emitter of the bipolar transistor also comprises a diode connected in parallel with the bias resistance, the conducting direction of said diode being the reverse of that of the base-emitter junction of the bipolar transistor.

According to another feature of the second variant, the other impedance connecting the source to the gate of the field effect transistor comprises a polarization or bias resistance.

According to another feature of the same variant, the other impedance connecting the source to the gate of the field effect transistor also comprises a diode connected in parallel with the bias resistance, the conducting direction of said diode being the same as that of the gate-source junction of the field effect transistor.

The invention is also characterized in that in the case where it applies to a load circuit in which flows a random direction or alternating current, the relay is connected between two terminals of a diagonal of a four diode rectifier bridge, two other terminals of the other bridge diagonal being connected to the two ends of the load circuit.

The invention is also characterized in that in the case where it is applied to a load circuit in which flows a random direction or alternating current, two relays using transistors of complimentary types, preferably protected by a series diode in the conducting direction, are connected to the two ends of the load circuit.

According to another embodiment, the invention also relates to a relay authorizing or interrupting the flow of a current in a load circuit comprising a static electronic switch having a terminal connected to one end of the load circuit and another terminal connected to another end of said circuit, and a control circuit having a control output connected to a control input of the switch for authorizing or interrupting the flow of current in the load circuit and between the two terminals of the switch, wherein the control circuit comprises a current amplifier polarized by the voltage available between said two ends of the load circuit.

According to another feature of this embodiment, the static electronic switch is a bipolar transistor, wherein an impedance is positioned between said terminals, is connected to the load circuit and in series to the collector of said transistor.

According to another feature, the impedance is a resistor.

According to another feature, the impedance is a diode, whose conducting direction is the same as that of the transistor.

BRIEF DESCRIPTION OF THE DRAWINGS

The invention is described in great detail hereinafter relative to non-limitative embodiments and the attached drawings, wherein show:

FIG. 1 Diagrammatically a relay according to the invention.

FIG. 2 Diagrammatically a first embodiment of a relay according to the invention and using a bipolar transistor.

FIG. 3 Diagrammatically another embodiment of a relay according to the invention using a field effect transistor.

DETAILED DESCRIPTION OF THE PREFERRED EMBODIMENTS

Figure 4:
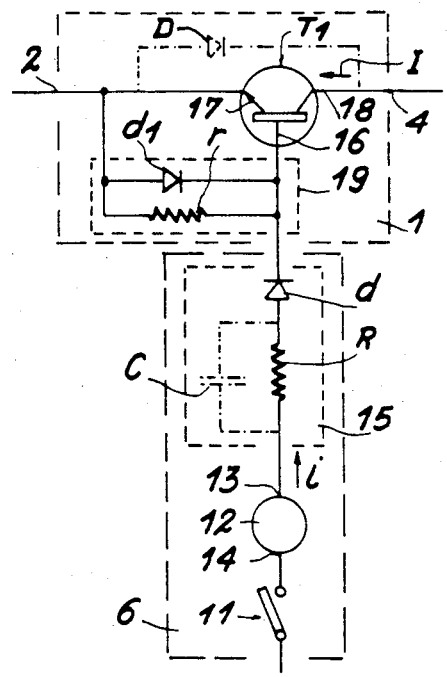
FIG. 4 In greater detail the relay of FIG. 2.

FIG. 1 diagrammatically shows a relay RS according to the invention making it possible to authorize or interrupt the flow of a current I in a load circuit U, e.g. comprising a load impedance Z. This load circuit is supplied by an electric power supply A.

This relay comprises a static switch 1, which will be described in greater detail hereinafter. This static switch comprises a terminal 2 connected to one end 3 of the load circuit & and another terminal 4 connected to another end 5 of said circuit. The relay also comprises a control circuit 6 having a control output 7 connected to a control input 8 of switch 1. This control circuit authorizes or interrupts the flow of current I in the load circuit and between the two terminals 2, 4 of switch 1.

Control circuit 6 comprises a supply input 9 connected to one point 10 of load circuit U. This point can be a reference earth if the actual load circuit has a reference earth. Connected in series between the supply input 9 and the control output 7, the control circuit comprises a control switch 11, a current generator 12 with two terminals 13, 14 and at least one impedance 15. This impedance limits the current I flowing in the control circuit when switch 11 is closed to a negligible value compared with the value of current I flowing in the load circuit U. As will be shown hereinafter, the voltage at terminals 13, 14 of generator 12 is at the least equal to the highest voltage between two random points of the load circuit.

As will be shown in detail hereinafter, the static switch 1 is constituted by a transistor whereof one control electrode constitutes the control input 8 connected to the control output 7 of the control circuit 6. The two other electrodes of this transistor respectively constitute the two terminals 2, 4 of the switch and are connected to the two ends 3, 5 of load circuit U. This transistor is blocked or off when the control switch 11 is open, whereas it is saturated when the switch is closed. The transistors used are either of the bipolar, or the field effect type.

The relay according to the invention shown diagrammatically in FIG. 1 functions in the following way. If I is the current flowing in the load circuit and i the current flowing in the control circuit, current i can be made negligible by using a high value resistor R. The current generator 12, whereof one of the terminals 14 is connected to one point 10 of the load circuit via switch 11 can be connected to a reference earth if the load circuit has a point connected to said reference earth. If $V_m$ is the absolute value of the highest potential difference that can be encountered between two random points of the load circuit, the invention proposes the use of a current generator 12, whose internal electromotive force e satisfies the condition $|e| \geq V_m$. The current i must simply have a value exceeding in absolute values a given value corresponding to the value of the current making it possible for the transistor of switch 1 to pass from the blocked state to the saturated state when switch 11 is closed. With regards to the electromotive force e of current generator 12, said electromotive force is preferably chosen so that $|e| > V_m$. For example, it is possible to choose as the value $|e| = 2V_m$. As a function of the direction of current I in the load circuit, when switch 12 is closed, the value of current i is between $$\frac{|e - V_m|}{R} \text{ and } \frac{|e + V_m|}{R}.$$

If $e = 2V_M$, the value of current i in the control circuit is between $$\frac{2VM - VM}{R} \text{ and } \frac{2VM + VM}{R},$$

i.e. between VM/R and 3VM/R. Said current i flowing in the control circuit when switch 12 is closed must have a value exceeding the value of the saturation current of the transistor of switch 1.

FIG. 2 diagrammatically shows a first embodiment of a relay RS according to the invention, where switch 1 comprises a bipolar transistor $T_1$. The components carry the same references as in FIG. 1. The e.g. npn transistor $T_1$ comprises a base 16 forming the control input 8 of switch 1. Emitter 17 and collector 18 of said transistor respectively constitute the two terminals 2, 4 of the switch and are connected to the two ends 3, 5 of the load circuit. According to a variant of the embodiment shown in FIG. 2, switch 1 also comprises another impedance 19 connecting base 16 and emitter 17 of the bipolar transistor, to maintain the latter in the off state when the control switch 11 is open. Impedances 15 and 19 will be described in greater detail hereinafter. It is clear that in this embodiment and as a function of the directions of the currents I in the load circuit and i in the control circuit, the bipolar transistor used can be a pnp transistor.

FIG. 3 diagrammatically shows another embodiment of a relay according to the invention, in which the same components carry the same references as in FIG. 1. In this embodiment, transistor $T_2$ of switch 1 is a field effect transistor, whose gate 20 constitutes the control electrode connected to the control circuit output 7. The source 21 and drain 22 of transistor $T_2$ constitute the terminals 2, 4 of switch 1, which are respectively connected to the ends 3, 5 of load circuit U. According to a variant of this embodiment, the switch also comprises an impedance 23 connecting the transistor source 21 to the transistor gate 20. As will be shown hereinafter, this impedance makes it possible to maintain the transistor in the off state when switch 11 is open.

FIG. 4 shows in greater detail the impedance 15, which makes it possible to limit the current in control circuit 6 when switch 11 is closed, as well as the impedance 19 making it possible to maintain the bipolar transistor of FIG. 2 in the off state when switch 11 is open.

Impedance 15, which makes it possible to limit the current in control circuit 6 comprises a high value resistor, which can be connected in series with a diode d, between the current generator 12 and the base 16 of transistor $T_1$ of switch 1. This diode prevents the passage of a reverse current in the emitter-base junction of transistor $T_1$. The conducting direction of this diode d is the same as that of the base-emitter junction of transistor $T_1$ and is clearly dependent on the transistor type (npn or pnp). Resistor R makes it possible to render negligible the value of the current i flowing in the control circuit compared with the value of the current I flowing in the load circuit. In the case where the relay has to function at high switching rates, the value of resistor R can introduce excessively high time constants with stray input capacitances of the control circuit. In this case, in order to compensate the stray input capacitances, a capacitor C is connected in parallel with resistor R, so that the time constant RC is identical to the time constant to be neutralised.

The impedance 19 connecting the base to the emitter of transistor $T_1$ makes it possible to maintain said transistor in the off state when the control switch 11 is open. This impedance comprises a resistance or resistor r connecting the base 16 of transistor $T_1$ to the emitter 17 thereof. It can also comprise a diode $d_1$ connected in parallel with resistor r to protect the emitter-base junction of transistor $T_1$ from reverse currents in said junction, if no diode d has been provided in impedance 15. The conducting direction of diode $d_1$ is obviously the reverse of that of the base-emitter junction of transistor $T_1$. Impedance 19 can be formed solely by the diode $d_1$.

A supplementary diode d could optionally be connected between the emitter and collector of transistor $T_1$ to complete the protection of the emitter-collector junction of said transistor against reverse voltages from the load circuit.

Figure 5:
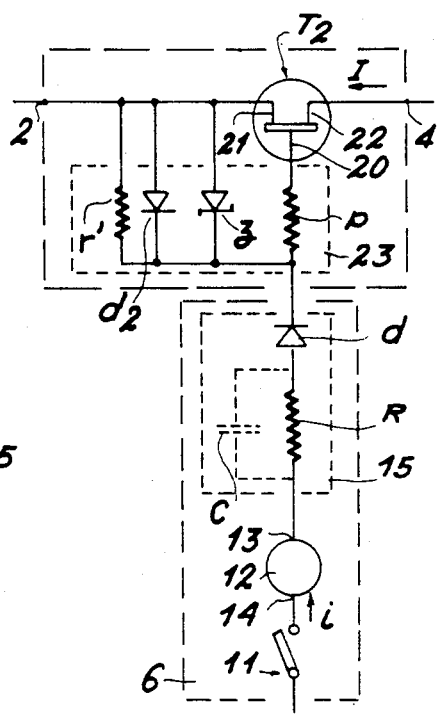
FIG. 5 In greater detail the relay of FIG. 3.

FIG. 5 diagrammatically and in more detailed manner shows the impedance 15 limiting the current in the control circuit of switch 1 comprising a field effect transistor $T_2$, as in the embodiment of FIG. 3. It is also possible to see in greater detail the other impedance 23 connecting the gate 20 of field effect transistor $T_2$ to the transistor source 21. The same components carry the same references as in FIG. 3. Impedance 15 making it possible to limit the current in the control circuit is formed in the same way as in the case where switch 1 comprises a bipolar transistor. The high value resistor R renders negligible the value of the current in the gate 20 of field effect transistor $T_2$. Diode d, which can be in series with resistor R, has a conducting direction which is the reverse of that of the gate-source junction of transistor $T_2$, because it is necessary to avoid direct currents in said junction. Capacitor C connected in parallel with resistor R intervenes in the case where the relay is used for switching voltages at high frequencies.

Impedance 23 connected between the gate 20 of transistor $T_2$ and its source 21 comprises a polarization or bias resistor r' enabling the field effect transistor to be maintained in the off state, when the gate is not polarized by a control voltage (i.e. when switch 11 is open). When no diode d is provided in impedance 15 for preventing direct currents in the gate-source junction of transistor $T_2$, impedance 23 comprises a diode $d_2$ or a Zener diode z connected in parallel with resistor r' between the gate 20 and source 21 of transistor $T_2$. These diodes $d_2$ or z have a conducting direction which is the same as that of the gate-source junction of transistor $T_2$. The directions of these junctions are obviously dependent on the type of FET used (n channel or p channel). Resistor r', as well as the diodes $d_2$ and z can also be connected to one terminal of a resistor p connecting the impedance 15 for limiting the current in the control circuit and gate 20 of transistor $T_2$. Resistor p makes it possible to avoid possible high frequency oscillations of the transistor, when the latter has to control high frequency switching operations. Zener diode z also makes it possible to limit the gate-source control voltage to a given value.

Figure 6:
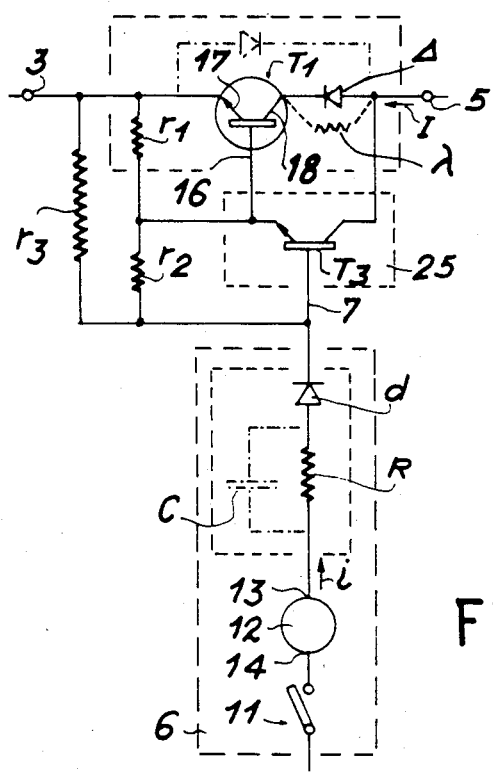
FIG. 6 Diagrammatically another embodiment of a relay according to the invention using a bipolar transistor and a current amplifier.

FIG. 6 shows another embodiment of a relay according to the invention, in the case where switch 1 comprises a bipolar transistor $T_1$, like that shown in FIG. 2 or 4. The same components carry the same references in FIG. 6 as in FIGS. 2 and 4. In this embodiment, the relay also comprises a current amplifier 25, e.g. constituted by at least one transistor of the same type as transistor $T_1$ of switch 1. This current amplifier is connected between the output 7 of the control circuit 6 and the base 16 of the bipolar transistor $T_1$. The current amplifier is in this case constituted by a single transistor which, from a current from the current generator 12, supplies the base-emitter control current of the bipolar transistor $T_1$, which brings about the saturation of said transistor when the control switch 11 is closed. This drawing also shows the resistors $r_1$, $r_2$, $r_3$ for polarizing the bases of transistor $T_1$ and the transistor of amplifier 25. The current amplifier shown in FIG. 6 has a single transistor $T_3$. It is obvious that it is possible to use a current amplifier having several transistors (e.g. a Darlington-type amplifier). Other current amplifier connections having several transistors are known in the state of the art and will not be described in detail here. The connection of the current amplifier 25 and the control circuit 6 is arranged in such a way that no current flows through the current amplifier 25 when the control switch 11 is open. Bipolar transistor $T_1$ of the switch is in this case blocked. As shown, the transistor $T_3$ of amplifier 25 is polarized by the voltage available between the ends 3, 5 of the load circuit.

A diode $\Delta$ can be connected to the collector of bipolar transistor $T_1$. The conducting direction of said diode is the same as that of the current flowing in the collector-emitter circuit of said transistor. Load circuit ends 3, 5 are respectively connected to one of the electrodes of said diode and to the emitter 17 of the bipolar transistor. Diode $\Delta$ makes it possible to obtain an adequate potential difference to permit the correct operation of the transistor or transistors of the current amplifier 25. This diode can be replaced by a resistor $\lambda$ represented by broken lines in the drawing. Current amplifier 25 does not require an auxiliary supply, being supplied by tapping the current I flowing in the load circuit, in such a way that the sum of the capped currents and the control current i is equal to the current I flowing in the load circuit.

The use of a current amplifier for controlling switch 1 makes it possible to bring about the saturation of the transistor of said switch with a current i of negligible value compared with the current I flowing in the load circuit.

A certain number of remarks are necessary regarding the current amplifiers making it possible to control the transistor $T_1$ of the switch (particularly the Darlington-type amplifiers), as well as on the presence of a diode $\Delta$ or a resistor $\lambda$ connected to the collector of transistor $T_1$, in order to provide a better understanding of the embodiment of FIG. 6.

Consideration will firstly be given to the case of a maximum simplicity Darlington current amplifier. This amplifier can e.g. be the connection of FIG. 6 in which resistors $r_1$, $r_2$ and $r_3$ have been eliminated. It is assumed that the collector of transistor $T_1$ is directly connected to the terminal 5 of the load circuit (no diode $\Delta$ or resistor $\lambda$). In this case, when the transistor $T_1$ is in the saturated state, the emitter-collector potential drop of said transistor exceeds that which would appear between said emitter and said collector if the transistor was not included in a Darlington-type connection. This potential drop is even higher if several Darlington-type current amplifier stages not including a resistor are connected in cascade. In this case, the emitter-base potential drops of each of the transistors are summated and between the base and collector of the switch transistor $T_1$, there is a voltage equal to the sum of the potential drops in the cascade-connected transistors. This excessively high voltage makes it possible for the transistor $T_1$ to operate at its saturation maximum.

As most of the current I passes through the transistor $T_1$ and the Joule effect in $T_1$ is equal to the product of the current passing through it by the voltage drop at its terminals, for high current values, there is a considerable Joule effect in the junctions of $T_1$.

The circuit of FIG. 6 makes it possible to obviate these disadvantages by including either a resistor $\lambda$, or a diode $\Delta$ between the collector of transistor $T_1$ and the terminal 5 of the load circuit. This low value resistor or diode leads to a limited potential drop ($V_\lambda$ or $V_\Delta$) of the collector of transistor $T_1$, which is just sufficient to enable said transistor to operate under optimum saturation conditions. The transistor $T_1$ is then polarized by an emitter-base potential difference ($V_{E1B1}$) exceeding the emitter-collector potential difference ($V_{E1C1}$) because:

$$V_{E1B1} = V_{E1C1} + V_\lambda \text{ (or } V_\Delta\text{)};$$

which imposes:

$$V_{E1B1} > V_{E1C1}.$$

There is then a better saturation of transistor $T_1$, leading to a lower potential drop $V_{E1C1}$ and therefore a lower Joule effect in transistor $T_1$. However, there is a Joule effect in resistor $\lambda$ or diode $\Delta$, but said Joule effect has the following special features. It is easy to dissipate, because there is no limitation on a resistor to as low a temperature value as that which must not be exceeded on a semiconductor junction unless destruction thereof will occur.

Thus, it is possible to accept for simple resistors, much higher temperature rises without any risk of damaging them. Through being able to accept these temperature rises, there is an improvement to the heat exchange factor with the ambient medium, which makes it possible to reduce or eliminate any radiator on said resistors.

Moreover, experience has shown that it is possible to find an optimum value of the resistance $\lambda$, so that the sum of the potential drops $V_{E1C1} + V_{80}$ does not exceed, or can even be below the potential drop $V_{E1C1}$ in a connection having no resistor $\lambda$, for the same current I in the load circuit.

Thus, the invention not only makes it possible to not increase, but even decrease the total Joule effect and to dissipate part of said Joule effect outside of transistor $T_1$ into resistor $\lambda$. As has been shown, this resistor offers much better operating reliability and dissipation possibilities. The reduction of the Joule effect in transistor $T_1$ then makes it possible to proportionally reduce the exchange surface of its radiator.

In order to block transistor $T_1$ in a reliable and better defined manner (insensitive to interference), the base of transistor $T_1$ is connected to its emitter by a resistor $r_1$, even when $T_1$ operates under saturation conditions, as shown in FIG. 6. To prevent resistor $r_1$ disturbing the saturation of $T_1$, it is merely necessary for said resistor to have a value such that the current which it taps from the base of transistor $T_1$ is low, relative to the current in the base when transistor $T_1$ is saturated. Resistors $r_2$ and $r_3$ were described hereinbefore.

Figure 7:
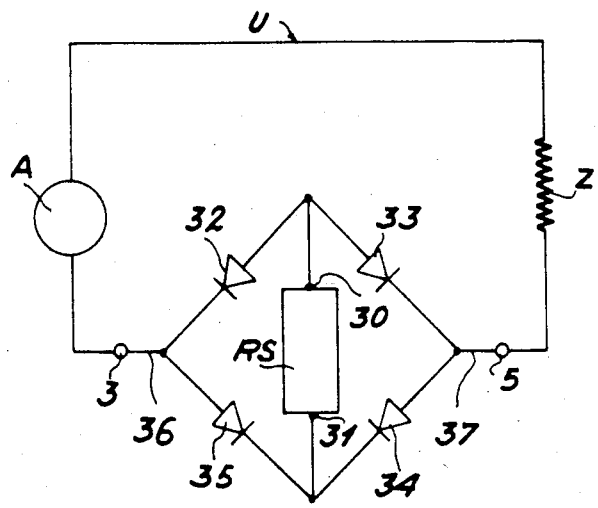
FIGS. 7 Special cases of the application of a relay 8 & 9 according to the invention.

FIG. 7 permits a better understanding of the application of a relay according to the invention to a load circuit U in which flows a random direction or alternating current. It is assumed that the load current is supplied by an alternating current source A and that the electric load of said current is represented at Z. It is also possible to see in FIG. 7 two of the ends 3, 5 of the load circuit, between which the relay according to the invention performs switching operations. In this application, the relay RS is connected between two terminals 30, 31 of a diagonal of a rectifier bridge with four diodes 32, 33, 34, 35, which is well known in the art. Two other terminals 36, 37 of the other bridge diagonal are connected to the two ends 3, 5 of the load circuit U. Thus, the transistor of the relay switch, as well as the transistors of a possible current amplifier of said transistor are traversed by currents in the same direction.

Figure 8:
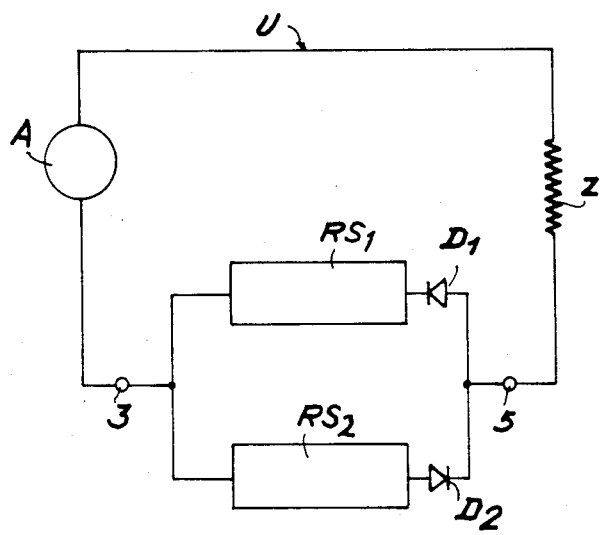

FIG. 8 shows another application of relays according to the invention, which perform switching operations in a load circuit U comprising an electric load Z in which flows a random direction or alternating current. In this case, two relays RS1, RS2 according to the invention, which are of complimentary polarities and which are protected by a rectifier diode in the conducting direction ($D_1$, $D'_1$) are connected in parallel between the two ends 3, 5 of the load circuit U. These relays, which are not shown in detail in FIG. 8, respectively use transistors of complimentary types. The switches of their respective control circuits can be controlled parallel or individually, as a function of whether it is wished to switch for any random direction of the load current, or for a single direction thereof.

Figure 9:
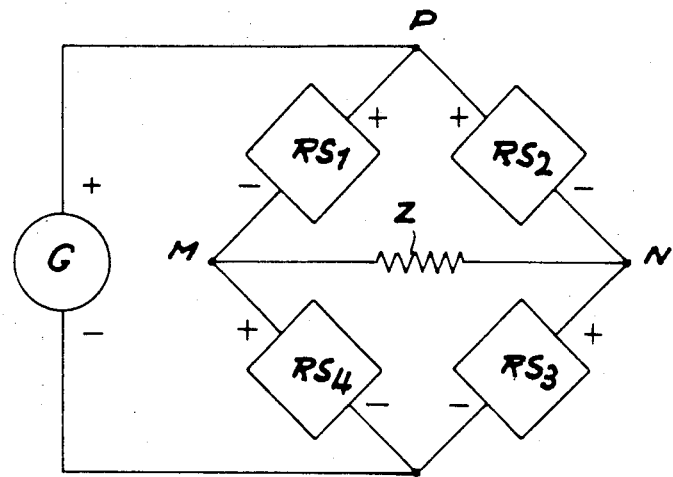

FIG. 9 shows the application of relays RS1, RS2, RS3, RS4 according to the invention and represented diagrammatically by rectangles on the drawing to a bipolar inverter.

If a current i' flows in the land circuits of the switches corresponding to relays RS1 and RS3, the transistors of the corresponding switches (transistors $T_1$ in the previous drawings) are saturated (said transistors being blocked in the absence of current). Everything then takes place as if the terminal M of load Z was connected to the positive pole P of generator G and as if the terminal Z of the load was connected to the negative pole G of the generator.

However, if a current i' flows in the control circuits of the switches corresponding to relays RS2 and RS4, the load terminals M is connected to the negative pole Q of generator G and the load terminal N is connected to the positive pole P of the generator. This bridge connection in which load Z occupies one of the bridge diagonals, the generator occupies the other bridge diagonal and the relays occupy the bridge branches, operates like an inverter of the direction of the current in load Z. When no current i' flows in the control circuits, load Z is not supplied. The inverter circuit is in fact a three-state inverter or NOT circuit.

What is claimed is:

1. A relay authorizing or interrupting the flow of a current in a load circuit, said circuit having in series between two ends an electric power supply and a load, comprising a static electronic switch having one terminal connected to one end of the load circuit and another terminal connected to another end of said circuit, and a control circuit having a control output connected to a control input of the switch to authorize or interrupt the flow of current in the load circuit and between the two switch terminals, wherein the control circuit comprises a supply input connected to one point of the load circuit and, connected in series between said input and the control output, a control switch, a current generator with two terminals and at least one impedance limiting the current flowing in the control circuit to a negligible value compared with the value of the current flowing in the load circuit when said flow is authorized by the closing of the switch, the voltage at the generator terminals being at least equal to the highest voltage between two random points of the load circuit.

2. A relay according to claim 1, wherein the static switch is a transistor having a control electrode connected to the control output of the control circuit, two other electrodes of said transistor being respectively connected to the two ends of the load circuit, said transistor being blocked when said control switch is open and being saturated when said control switch is closed.

3. A relay according to claim 2, wherein the transistor is a bipolar transistor, whose base constitutes the control electrode and whose emitter and collector constitute the two electrodes respectively connected to the two ends of the load circuit.

4. A relay according to claim 3, wherein the switch also comprises another impedance connecting the base and emitter of the bipolar transistor, so as to maintain said transistor in the off state when the control switch is open.

5. A relay according to claim 2, wherein said transistor is a field effect transistor, whose gate constitutes the control electrode and whose source and drain constitute the electrodes respectively connected to the two ends of the load circuit.

6. A relay according to claim 5, wherein the switch also comprises another impedance connecting the source and gate of the field effect transistor to keep said transistor in the off state when the control switch is open.

7. A relay according to claim 3, wherein said switch also comprises a current amplifier connected between the output of the control circuit and the base of the bipolar transistor to produce an emitter-base current of the bipolar transistor bringing about the saturation of the latter from the current supplied by the current generator, when the control switch is closed.

8. A relay according to claim 7, wherein the current amplifier is an amplifier comprising at least one transistor, the latter being polarized by the voltage available between said ends of the load circuit.

9. A relay according to claim 8, wherein the current amplifier is connected in such a way as not to be traversed by any current when the control switch is open and the bipolar transistor blocked.

10. A relay according to claim 8, wherein a diode is connected to the collector of the bipolar transistor, the conducting direction of said diode being that of the current flowing in the emitter-collector junction of the transistor, the ends of the load circuit being respectively connected to one of the electrodes of said diode and to the emitter of the bipolar transistor.

11. A relay according to claim 2, wherein the impedance limiting the value of the current flowing in the control circuit comprises a high value resistor to render negligible the said current compared with that current flowing in the load circuit.

12. A relay according to claim 11, wherein the impedance limiting the current also comprises a diode connected in series with the high value resistor, the conducting direction of said diode corresponding to the direction of the current in the control electrode of the transistor.

13. A relay according to claim 4, wherein the other impedance connecting the base to the emitter of the bipolar transistor comprises a polarization resistor.

14. A relay according to claim 13, wherein the other impedance connecting the base to the emitter of the bipolar transistor comprises a diode connected in parallel with the polarization resistor, the conducting direction of said diode being the reverse of that of the base-emitter junction of the bipolar transistor.

15. A relay according to claim 6, wherein the other impedance connecting the source to the gate of the field effect transistor comprises a polarization resistor.

16. A relay according to claim 15, wherein the other impedance connecting the source to the gate of the field effect transistor also comprises a diode connected in parallel with the polarization resistor, the conducting direction of said diode being the reverse of that of the gate-source junction of the field effect transistor.

17. A relay according to claim 1 wherein the static electronic switch is a bipolar transistor, and wherein an impedance is positioned between said terminals, connected to the load circuit and in series with the collector of said transistor.

18. A relay according to claim 17, wherein said impedance is a resistor.

19. A relay according to claim 17, wherein said impedance is a diode, whose conducting direction is the same as that of the transistor.

* * * * *